(12) United States Patent
Oh

(10) Patent No.: US 9,036,418 B2
(45) Date of Patent: May 19, 2015

(54) READ VOLTAGE GENERATION CIRCUIT, MEMORY AND MEMORY SYSTEM INCLUDING THE SAME

(71) Applicant: SK hynix Inc., Gyeonggi-do (KR)

(72) Inventor: Seung-Min Oh, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 51 days.

(21) Appl. No.: 13/745,272

(22) Filed: Jan. 18, 2013

(65) Prior Publication Data
US 2013/0258778 A1  Oct. 3, 2013

(30) Foreign Application Priority Data

Mar. 30, 2012 (KR) .................. 10-2012-0033358

(51) Int. Cl.
*G11C 16/04* (2006.01)
*G11C 16/26* (2006.01)
*G11C 11/56* (2006.01)
*G11C 16/16* (2006.01)

(52) U.S. Cl.
CPC ............. *G11C 16/26* (2013.01); *G11C 16/16* (2013.01); *G11C 11/5642* (2013.01); *G11C 16/0483* (2013.01)

(58) Field of Classification Search
CPC ......... G11C 16/08; G11C 16/10; G11C 16/16
USPC ................. 365/185.11, 230.03, 201, 236
See application file for complete search history.

(56) References Cited

U.S. PATENT DOCUMENTS 6,256,230 B1 * 7/2001 Miwa et al. ............... 365/185.24
6,961,266 B2 * 11/2005 Chang ...................... 365/185.03
7,016,231 B2 * 3/2006 Kubo ........................ 365/185.18
7,936,601 B2 * 5/2011 Kang et al. ............... 365/185.03

* cited by examiner

*Primary Examiner* — Connie Yoha
(74) *Attorney, Agent, or Firm* — IP & T Group LLP

(57) ABSTRACT

A read voltage generation circuit includes a register unit configured to store an initial read voltage code, a counter circuit configured to change a read voltage code in every read-retry operation, wherein an initial value of the read voltage code is the initial read voltage code; and a voltage generation circuit configured to generate a read voltage corresponding to a read voltage code produced by the counter circuit.

6 Claims, 6 Drawing Sheets

READ VOLTAGE GENERATION CIRCUIT, MEMORY AND MEMORY SYSTEM INCLUDING THE SAME

CROSS-REFERENCE TO RELATED APPLICATIONS

The present application claims priority of Korean Patent Application No. 10-2012-0033358, filed on Mar. 30, 2012, which is incorporated herein by reference in its entirety.

BACKGROUND

1. Field

Exemplary embodiments of the present invention relate to a memory and a memory system, and more particularly, to a technology relating to a read-retry operation of a memory.

2. Description of the Related Art

Memory devices are divided into a volatile memory device and a nonvolatile memory device depending on whether the memory devices keep the data when supply of power is stopped. The volatile memory device is a memory device in which data is deleted when supply of power supply is interrupted, a DRAM and an SRAM pertain to the volatile memory device. The nonvolatile memory device is a memory device that keeps the stored data even if supply of power is stopped and a flash pertains to the nonvolatile memory device.

FIG. 1A illustrates threshold voltage distribution of Single-Level Cell (SLC) memory cells in a flash memory and FIG. 1B illustrates threshold voltage distribution of Multi-Level Cell (MLC) memory cells.

Referring to FIG. 1A, programmed memory cells have distribution of threshold voltage indicated by P and non-programmed (that is, erased-state) memory cells have distribution of threshold voltage indicated by E. The voltage that is used to discriminate the programmed state P and the erased state E is a read voltage VREAD, and the read voltage is set at an appropriate level that makes it possible to discriminate the programmed state P and the erased state E. In a flash memory, the distribution of threshold voltage may be changed according to repetition of programming and erasing the memory cells or according to the influence from the peripheral cells. When the cell distribution changes as indicated by the dotted lines and reading is performed by using the read voltage VREAD in the related art, it can be seen that a read fail of recognizing the data of the memory cells in the programmed state wrong as being in the erased state may be generated.

On the other hand, this problem may become more serious in MLC memory cells using a plurality of read voltages VREAD1, VREAD2, and VREAD3 and having a small margin among the distributions E, P1 P2, and P3.

The read-retry operation performs a read-retry operation again by changing the level of a read voltage when reading fails. Referring to FIGS. 2A and 2B, it can be seen that reading is achieved by performing reading several times with changes in level of the read voltages VREAD, VREAD1, VREAD2, and VREAD3 in order of (1)→(2)→(3). That is, the read-retry operation performs reading again while changing the level of the read voltages VREAD, VREAD1, VREAD2, and VREAD3 until reading is achieved, when reading falls.

FIG. 3 is a diagram illustrating a read voltage generation circuit of the related art for supporting a read-retry operation.

Referring to FIG. 3, the level of a read voltage VREAD that should be produced in every reading is stored in a plurality of in registers 301 to 304. A read voltage code CODE1 for the first reading is stored in the register 301, a read voltage code CODE2 for second reading (that is, the first read-retry operation) is stored in the register 302, and a read voltage code CODEN for the N-th reading is stored in the register 304.

The voltage generation circuit 310 generates a read voltage VREAD corresponding to the value of the read voltage code CODE1 in the first reading and generates a read voltage VREAD corresponding to the value of the read voltage code CODE2 in the second reading. Further, the voltage generation circuit 310 generates a read voltage VREAD corresponding to the value of the read voltage code CODEN in the N-th reading.

In such a type of read voltage generation circuit, the registers 301 to 304 should be store the read voltage codes CODE1 to CODEN. Therefore, many registers 301 to 304 may be needed and the area of the read voltage generation circuit increases. Further, it may be necessary to generate at least three read voltages VREAD1 VREAD2, and VREAD3 in order to support the MLC type of reading, so that the number of registers greatly increases to 3*N. Further, since it may be necessarily required to use the read voltage codes CODE1 to CODEN that have been stored in the registers 301 to 304, there is a concern that it may be difficult to variously adjust the level of the read voltage VREAD.

SUMMARY

Exemplary embodiments of the present invention are directed to reduce the area of a read voltage generation circuit and to variously adjust the level of a read voltage that is generated by the read voltage generation circuit.

In accordance with an embodiment of the present invention, a read voltage generation circuit includes a register unit configured to store an initial read voltage code, a counter circuit configured to change the initial read voltage code that is an initial value into a read voltage code and to change the read voltage code to another voltage code in every read-retry operation, and a voltage generation circuit configured to generate a read voltage corresponding to the read voltage code produced by the counter circuit.

In accordance with another embodiment of the present invention, a memory includes a plurality of memory blocks, a row circuit configured to apply a read voltage to a selected page in a selected memory of the plurality of memory blocks, a data access circuit configured to read data from the selected page, a register configured to store an initial read voltage code, a counter circuit configured to change a read voltage code in every read-retry operation, wherein an initial value of the read voltage code is the initial read voltage code, and a voltage generation circuit configured to generate the read voltage corresponding to the read voltage code produced by the counter circuit.

In accordance with still another embodiment of the present invention, a memory system includes a memory configured to include a plurality of memory blocks and a read voltage generation circuit configured to generate a read voltage that is the reference of reading of a selected memory in the memory blocks, and a memory controller configured to give an instruction of a read-retry operation on the selected memory block to the memory when reading on the selected memory block has failed, in which the read voltage generation circuit includes a register configured to store an initial read voltage code, a counter circuit configured to change a read voltage code in every read-retry operation, wherein an initial value of the read voltage code is the initial read voltage code, and a voltage generation circuit configured to generate a read voltage corresponding to the read voltage code produced by the counter circuit.

DETAILED DESCRIPTION

Exemplary embodiments of the present invention will be described below in more detail with reference to the accompanying drawings. Only portions needed to understand an operation in accordance with exemplary embodiments of the present invention will be described in the following description. It is to be noted that descriptions of other portions will be omitted so as not to make the subject matters of the present invention obscure.

Exemplary embodiments of the present invention will be described below with reference to the accompanying drawings in order for those skilled in the art to be able to easily implement the technical spirit of the present invention.

Figure 4:
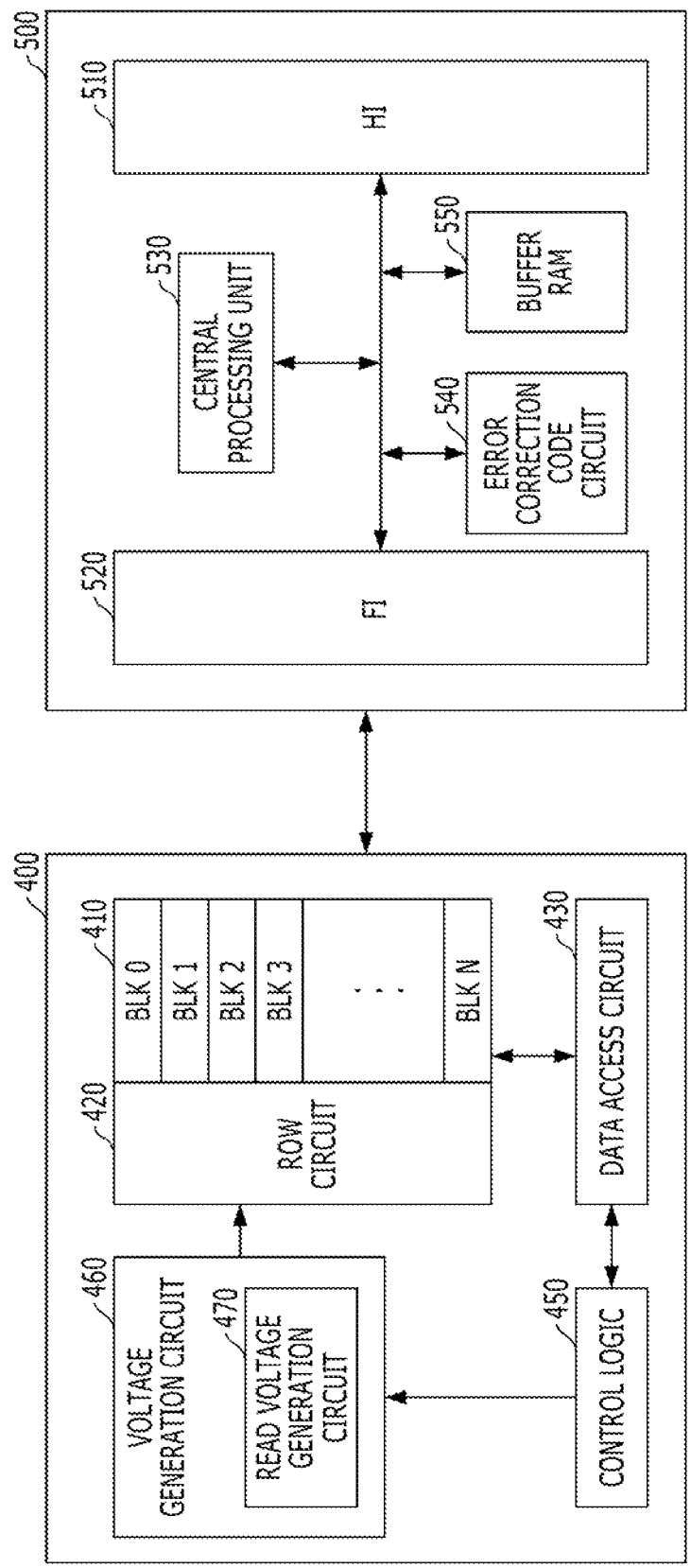
FIG. 4 is a diagram of a memory system in accordance with an embodiment of the present invention.

FIG. 4 is a diagram of a memory system in accordance with an embodiment of the present invention.

Referring to FIG. 4, a memory system includes a memory 400 and a memory controller 500.

The memory 400 includes a cell array 410, a row circuit 420, a data access circuit 430, a control logic 450, and a voltage generation circuit 460. Further, the voltage generation circuit 460 includes a read voltage generation circuit 470.

The cell array 410 includes a plurality of memory blocks BLK0 to BLKN. For a NAND type flash memory, a program or reading may be performed for each page and erasing may be performed for each block including a plurality of pages. Word lines, bit lines, and cell strings are included in each of the memory blocks. A drain selection transistor, a source selection transistor, and a plurality of memory cells are included in each of the cell strings.

The control logic 450 controls the row circuit 420, the voltage generation circuit 460, and the data access circuit 430 according to an operation mode (for example, program, reading, and erasing).

The voltage generation circuit 460 can generate word line voltages (for example, a program voltage VPGM, a read voltage VREAD, and a pass voltage VPASS) to be supplied to the word lines, respectively, and a voltage to be supplied to a bulk (for example, a well region) where the memory cells are formed. The operation of generating a voltage of the voltage generation circuit 460 may be performed by the control of the control logic. In particular, a read voltage generation circuit 470 is disposed in the voltage generation circuit 460 and generates a read voltage VREAD to be used for reading and a read-retry operation.

The row circuit 420 selects one memory block from the memory blocks BLK 0 to BLK N in the cell array 410 according to the control of the control logic 450 and provides the voltages generated from the voltage generation circuit 460 to a selected word line and a non-selected word line in the selected memory block.

The data access circuit 430 may be composed of a plurality of buffers corresponding to the bit lines or pairs of the bit lines. The data access circuit 430 is controlled by the control logic 450 and may operate as a sense amplifier or a write driver according to the operation mode. For example, the data access circuit 430 may operate as a write driver that drives the bit lines according to data to be stored in the cell array 410, in programming. The data access circuit 430 receives data to be programmed in the cell array 410 from the buffer and can drive the bit lines according to the input data. The data access circuit 430 operates as a sense amplifier that reads the data programmed in the cell array 410, in reading. The data to be programmed in the cell array 410 by the data access circuit 430 and the data read from the cell array 410 by the access circuit 430 are sent/received to/from a memory controlled 500 through the buffer (not illustrated).

The data access circuit 430 can perform a read-retry operation until read pass is achieved without a read fail according to the control of the control logic 450. In the read-retry operation, reading is performed by a read voltage VREAD at a new level (level different from the previous level) generated from the read voltage generation circuit 470.

The memory controller 500 may include a host interface (HI) 510, a flash interface 520 (FI), a central processing unit (CPU) 530, an error correction code circuit (ECC) 540, and a buffer RAM 550.

The central processing unit 530 is configured to control the whole operation of the memory controller 500. One or more central processing units 530 may be disposed in the memory controller 500. The host interface 510 can exchange a command, an address and data with a host according to the control of the central processing unit 530. The host interface may support one of interfaces such as a Universal Serial Bus (USB), a Multi Media Card (MMC), a PCI-Express (PCI-E), an Advanced Technology Attachment (ATA), a Serial Advanced Technology Attachment (SATA), a Parallel AT Attachment (PATA), a Small Computer System Interface (SCSI), a Serial Attached SCSI (SAS), an Enhanced Small Disk Interface (ESDI), and an Integrated Drive Electronics (IDE). The flash interface 520 can exchange data between the buffer RAM 550 and the flash memory 400 according to the control of the central processing unit 530.

The error correction code circuit 540 generates ECC data from main data, the data that is transmitted to the memory 400 for programming. The ECC data generated by the error correction code circuit 540 is stored in the cell array 410 of the memory 400, together with the main data. The error correction code circuit 540 is configured to detect and correct an error in the data read from the memory 400. When an error in the data read from the memory 400 can be recovered by the ECC function, the error correction code circuit 540 corrects the error in the read data. In contrast, when the data read from the memory 400 cannot be corrected even by the ECC function, the error correction code circuit 540 determines whether reading has failed or not. That is, when an error is not in the data read from the memory 400 or can be recovered, the error correction code circuit 540 determines that reading has passed, but when an error in the data read from the memory 400 cannot be recovered, the error correction code circuit 540 determines that reading has failed. The information of pass/fail of reading determined by the error correction code circuit 540 is provided to the control logic 450 of the memory 400 through the flash interface 520. The control logic 450 can control the data access circuit 430, the read voltage generation circuit 470 of the voltage generation circuit 460 and the row circuit 420 such that a read-retry operation can be performed on the page that has been read, in response to the pass/fail information of reading transmitted from the control logic 450.

The buffer RAM 550 performs a function of temporarily storing data read from the memory 400 or data provided from a host and a function of storing a firmware such as FTL or software.

Figure 5:
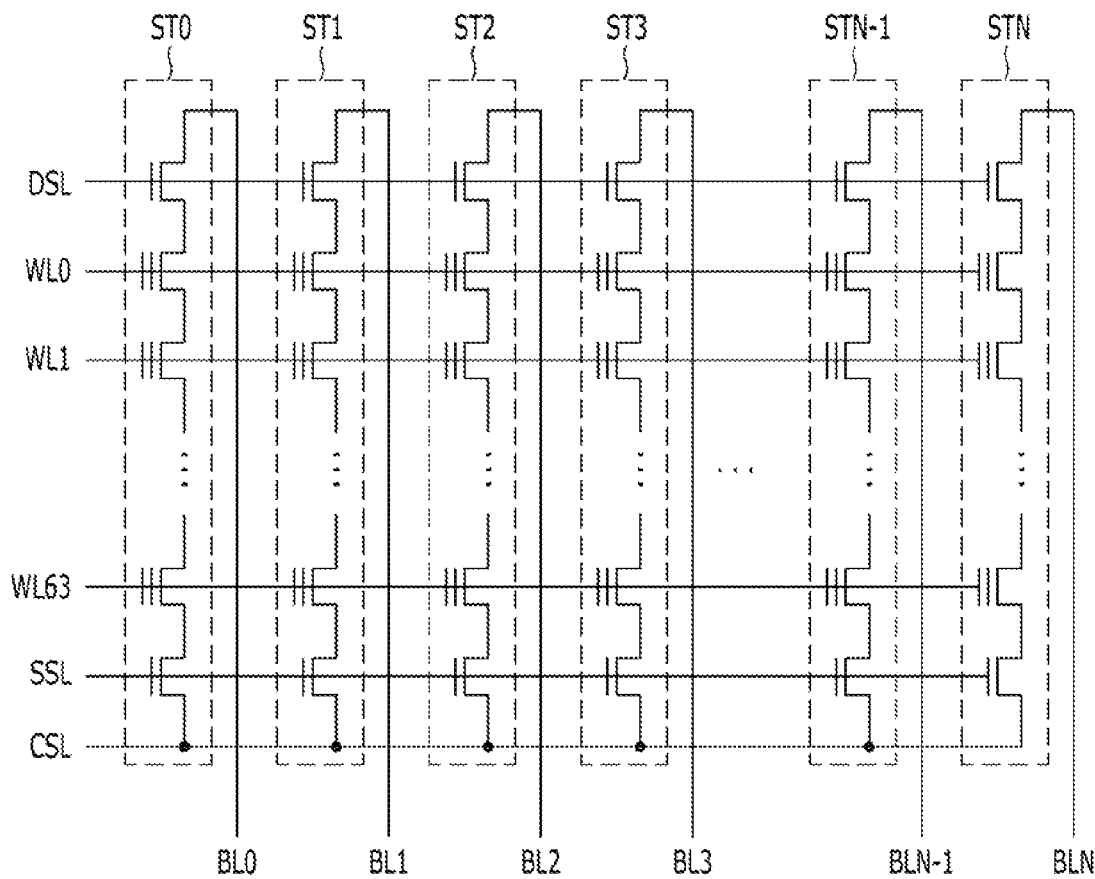
FIG. 5 is a diagram illustrating a block BLK0 in a cell array shown in FIG. 4.

FIG. 5 is a diagram illustrating a block BLK0 in a cell array shown in FIG. 4.

Referring to FIG. 5, the block BLK0 includes a plurality of cell strings ST0 to STN. The cell strings ST0 to STN each include memory cells that are controlled by the word lines WL0 to WL63, a drain selection transistor that electrically connects the cell strings ST0 to STN with the bit lines BL0 to BLN according to the control of a drain selection line DSL, and a source selection transistor that electrically connects the cell strings ST0 to STN with a common source line CSL according to the control of a source selection line SSL.

In reading and read-retry operation, the row circuit 420 controls the drain selection line DSL, the source selection line SSL, and the non-selected word lines (the other word lines, except for one of WL0 to SL63) such that the drain selection transistors, the source selection transistors, and the memory cells corresponding to the non-selected word lines are turned on. Further, the row circuit 420 applies the read voltage VREAD generated by the read voltage generation circuit 470 to the selected word line (one word line in WL0 to WL63).

For reference, the memory cells corresponding to one word line in the block BLK0 produces one page.

Figure 6:
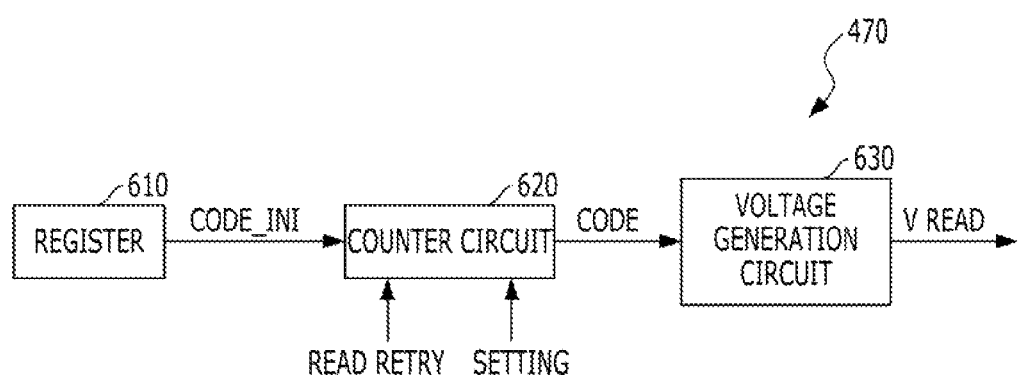
FIG. 6 is a configuration diagram illustrating an embodiment of the read voltage generation circuit shown FIG. 4.

FIG. 6 is a diagram illustrating an embodiment of the read voltage generation circuit shown in FIG. 4.

Referring to FIG. 6, the read voltage generation circuit 470 includes a register unit 610, a counter circuit 620, and a voltage generation circuit 630.

Figure 1A:
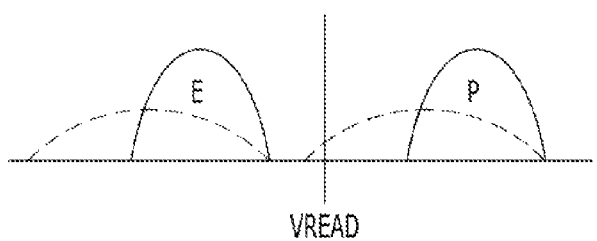
FIG. 1A is a diagram illustrating threshold voltage distribution of SLC memory cells in a flash memory and FIG. 1B is a diagram illustrating threshold voltage distribution of MLC memory cells.
Figure 1B:
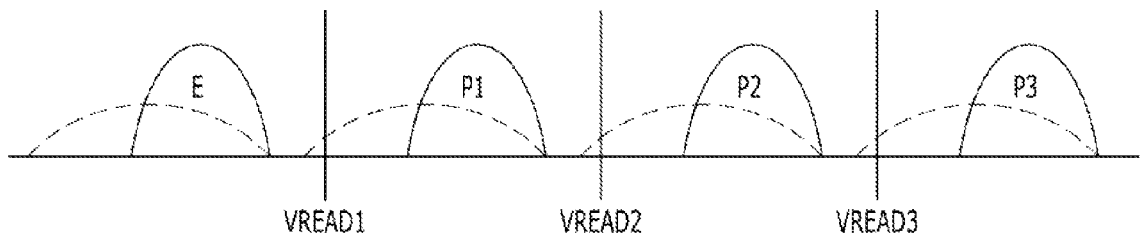
Figure 2A:
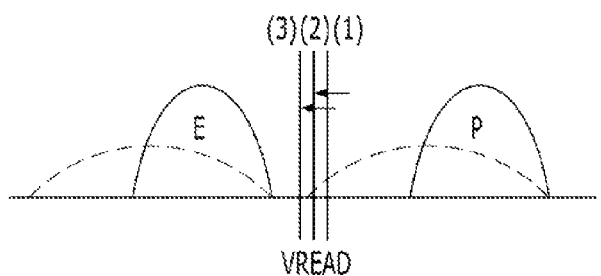
FIGS. 2A and 2B are diagrams illustrating a read-retry operation.
Figure 2B:
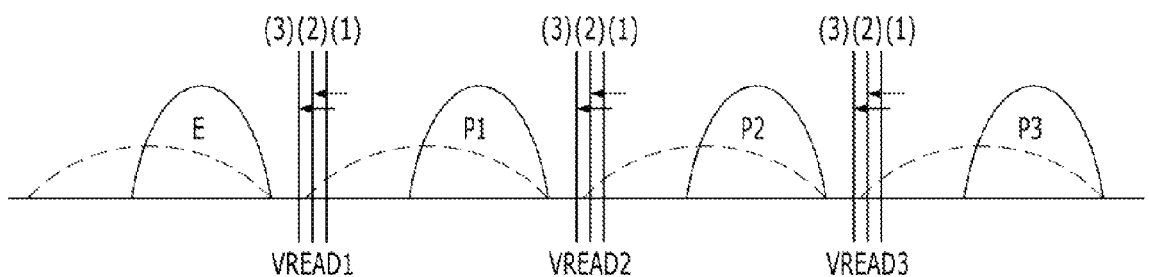
Figure 3:
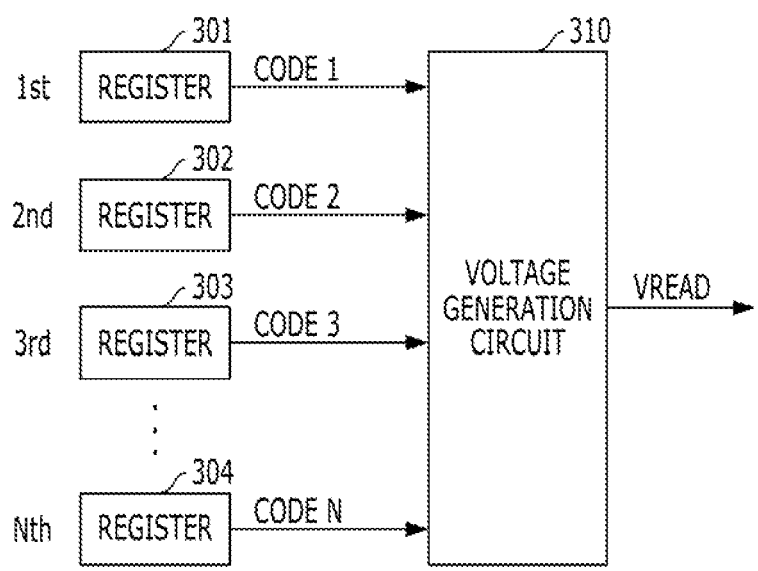
FIG. 3 is a diagram of a read voltage generation circuit of the related art for supporting a read-retry operation.

The register unit 610 stores an initial read voltage code CODE_INI. The initial read voltage code is a code that represents the value of a read voltage that is supposed to be generated in the first reading. In a read voltage generation circuit illustrated in FIG. 3, the code values CODE1 to CODEN of read voltages that are supposed to be generated in every reading (read-retry operation) in a plurality of registers were stored. However, in the present invention, only the initial read voltage code CODE_INI corresponding to only the initial read voltage is stored in the register unit 610. The initial read voltage code CODE_INI stored in the register 610 should not be lost, even if power is not supplied to the memory 400. Therefore, the register unit 610 is configured by a nonvolatile memory cell such as fuse circuit. Further, the register unit 610 is configured by a nonvolatile memory cell such as a latch circuit and the data (initial read voltage code) stored in another nonvolatile memory cell such as fuse circuit may be called after the initial power-up and then stored in the register unit 610.

The counter circuit 620 increases/decreases the value of the read voltage code CODE from the initial read voltage code every time an instruction of a read-retry operation is given. The control logic 450 sets whether the counter circuit 620 increases/decreases the value of a read voltage code and how a counting step of the counter circuit 620 goes. For example, the counter circuit may be set to decrease the value of the read voltage code CODE by 3 in every read-retry operation, to decrease the value of the read voltage code CODE by 1 in every read-retry operation, or increase the value of the read voltage code CODE by 2 in every read-retry operation. Meanwhile, when reading is passed, the value of the read voltage code CODE output from the counter circuit 620 may be initialized to the same value as that of the initial read code CODE_INI. Further, even though reading is passed, the value of the read voltage code CODE that is currently output from the counter circuit 620 may be kept and the read voltage code CODE, which was used when reading was passed, may be used as an initial value in the next reading.

In general it may be preferable to set the counting step of the counter circuit 620 to be smaller when data is stored in an MLC method in the memory cells of the memory block to be read than when data is stored in an SLC method. Further, it may be preferable that the higher the E/W cycle (erase/write (program) cycle) of the memory block to be read, the smaller the counting step of the counter circuit 620 is set. In recent, some memories use some of memory blocks in a cell array as SLC buffers and use the other bucks as MLCs, and in this case, it is possible to set the counting step of the counter circuit 621 to be large when a read voltage is supplied to the memory block that are used as SLCs, and to set the counting step of the counter circuit 620 to be small when a read voltage is supplied to the memory cells that operate as MLCs. Further, counting step of the counter circuit 620 may be set to decrease, every time the number of times of the read-retry operation increases. A 'READ RETRY' signal that is input to the counter circuit 620 is a signal representing that an instruction of a read-retry operation has been given, and the counter circuit 620 increases/decreases the value of the read voltage code CODE by a predetermined counting step, every time the signal is activated. Further, 'SETTING' that is input to the counter circuit 620 represents setting information about a counting step and increase/decrease that are provided to the counter circuit 620 from the control logic.

The voltage generation circuit 630 generates a read voltage VREAD corresponding to the read voltage code CODE produced by the counter circuit 620. The voltage generation circuit 630 may be configured to generate a read voltage VREAD at a higher level with an increase in value of the read voltage code CODE, and generates a read voltage VREAD at a lower level with a decrease in value of the read voltage code CODE.

The following Table 1 exemplifies the values of red voltage codes CODE and the levels of corresponding read voltages generated by the voltage generation circuit 630.

TABLE 1

| CODE | VREAD |
|---|---|
| 000000 | 0.80 V |
| 000001 | 0.85 V |
| 000010 | 0.90 V |
| 000011 | 0.95 V |
| 000100 | 1 V |
| 000101 | 1.05 V |
| 000110 | 1.1 V |
| ... | ... |
| 111111 | 3.95 V |

Figure 7:
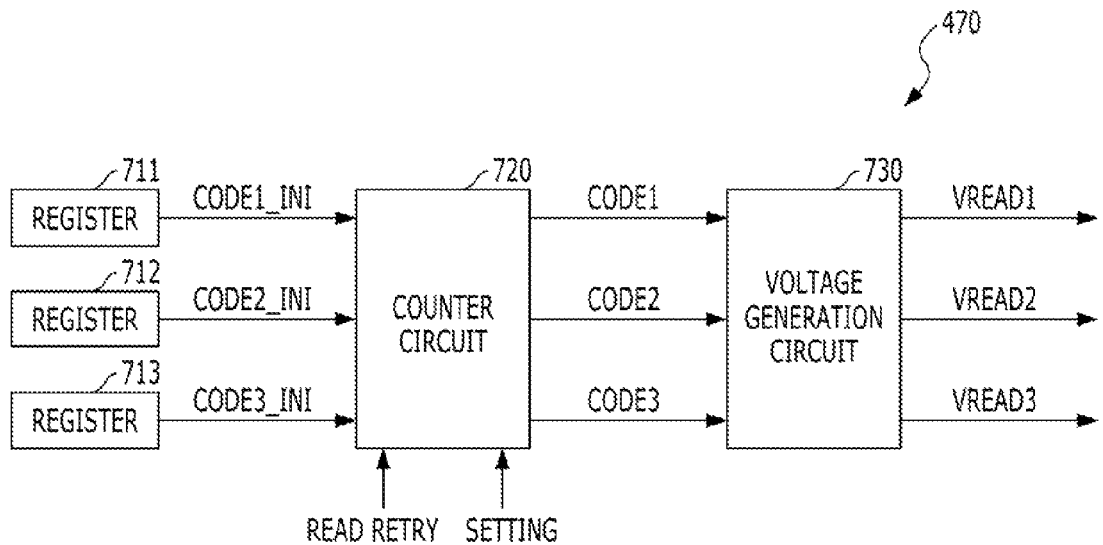
FIG. 7 is a diagram illustrating another embodiment of the read voltage generation circuit shown FIG. 4.

FIG. 7 is a diagram illustrating another embodiment of the read voltage generation circuit shown FIG. 4. FIG. 7 illustrates the read voltage generation circuit 470 that generates a plurality of read voltages VREAD1, VREAD2, and VREAD3.

Referring to FIG. 7, the read voltage generation circuit 470 includes a plurality of register units 711, 712, and 713, and the register units 711, 712, and 713 respectively store initial read voltage codes CODE1_INI, CODE2_INI, and CODE3_INI, which correspond to read voltages VREAD1, VREAD2, and VREAD3 respectively. Further, the counter circuit 710 increases/decreases the values of the read voltage codes CODE1, CODE2, and CODE3 in every read-retry operation, with the initial read voltage codes CODE1_INI, CODE2_INI, and CODE3_INI as initial values, respectively. Further, the voltage generation circuit 470 generates read voltages VREAD1, VREAD2, and VREAD3 corresponding to the read voltage codes CODE1, CODE2, and CODE3. Since the read voltages VREAD1, VREAD2, and VREAD3 at different levels do not need to be simultaneously provided to the row circuit 420, the voltage generation circuit 730 may generate the read voltage VREAD1 in response to the read voltage code CODE1 at a timing when the read voltage VREAD1 is required, and generate the read voltage VREAD2 in response to the read voltage code CODE2 at a timing when the read voltage VREAD2 is required.

The read voltage generation circuit 470 shown in FIG. 7 operates in the same way as the read voltage generation circuit 470 shown in FIG. 6, except for generating a plurality of read voltages VREAD1, VREAD2, and VREAD3, and the detailed description is not provided any more.

The read voltage generation circuit 470 in accordance with the embodiment of the present invention illustrated in FIGS. 6 and 7 stores only codes CODE_INI, CODE1_INI, CODE2_INI, and CDDE3_INI in the register units 610, 711, 712, and 713. Therefore, it is possible to considerably reduce the areas of the register units 610, 711, 712, and 713. Further, the values of the codes CODE, CODE1, CODE2, and CODES are increased/decreased according to predetermined counting steps in the counting method by the counting circuits 620 and 720, there is the advantage that it may be possible to generate read voltages VREAD, VREAD1, VREAD2, and VREAD3 with various sequences and levels.

Figure 8:
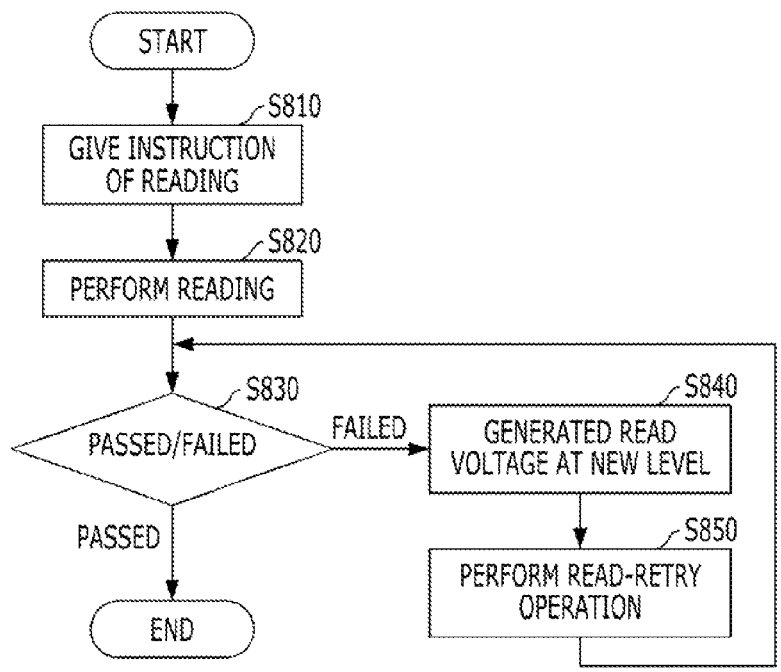
FIG. 8 is a flowchart illustrating a read-retry operation of a memory system in accordance with an embodiment of the present invention.

FIG. 8 is a flowchart illustrating a read-retry operation of a in memory system in accordance with an embodiment of the present invention.

Referring to FIG. 8, an instruction of reading is given to the memory 400 from the memory controller 500 in step S810. A read voltage VREAD corresponding to the initial read voltage code CODE_INI is generated by the read voltage generation circuit 470 and reading is performed on the basis of the read voltage VREAD, in step S820. The error correction circuit 540 of the memory controller 500 determines that fail/pass of reading in step S830, and when it is determined that reading has been passed, reading is finished. When it is determined that reading has failed, a new read voltage code CODE is generated by the counter circuit 620 of the read voltage generation circuit 470 and a corresponding read voltage VREAD is generated. Further, in step S850, reading is performed again on the basis of the new generated read voltage VREAD. It is determined again whether reading (read-retry operation) has been passed/failed, and reading is finished or the read-retry operation is performed in step S840 and S850 according to the result of determination.

After it is determined that reading has been passed in step S830, the value of the read code output from the counter circuit 620 is initialized to the initial read code CODE_INI or the value of the read code CODE current output from the counter circuit 620 is kept and can be used as the initial value in the next reading.

It was described in the exemplary embodiment that the error correction circuit 540 is provided in the memory controller 500 and the memory controller 500 gives an instruction of a read-retry operation to the memory 400, when it is determined that reading has failed by the error correction code circuit 540. However, it is apparent that the memory 400 can perform a read-retry operation by itself (that is, without an instruction from a memory controller), when the error correction code circuit 540 is provided in the memory 400 and the error correction code circuit 540 in the memory determines whether reading has failed.

While the present invention has been described with respect to the specific embodiments, it should be noted that the embodiments is for describing, not limiting, the present invention. It will be apparent to those skilled in the art that various changes and modifications may be made without departing from the spirit and scope of the invention.

In accordance with the embodiment of the present invention, only the information on the initial value of a read voltage is stored in the register and read voltages are generated by a voltage method in a read-retry operation. Therefore, the present invention has the advantage of being able to reduce the area of the read voltage generation circuit and of freely control the range of a change in read voltages in a read-retry operation.

While the present invention has been described with respect to the specific embodiments, it will be apparent to those skilled in the art that various changes and modifications may be made without departing from the spirit and scope of the invention. Accordingly, the scope of the invention is not limited to exemplary embodiments as described above and is defined by the following claims and equivalents to the scope the claims.

What is claimed is:

1. A read voltage generation circuit comprising:
a register unit configured to store an initial read voltage code;
a counter circuit configured to change a read voltage code in every read-retry operation, wherein an initial value of the read voltage code is the initial read voltage code; and
a voltage generation circuit configured to generate a read voltage corresponding to the read voltage code produced by the counter circuit,
wherein a counting step of the counter circuit is set to be small when a memory block that is provided with the read voltage operates as a Multi-Level Cell (MLC), and is set to be large when the memory block that is provided with the read voltage operates as a Single-Level Cell (SLC).

2. A read voltage generation circuit comprising:
a register unit configured to store an initial read voltage code;
a counter circuit configured to change a read voltage code in every read-retry operation, wherein an initial value of the read voltage code is the initial read voltage code; and
a voltage generation circuit configured to generate a read voltage corresponding to the read voltage code produced by the counter circuit,
wherein a counting step of the counter circuit is set to be small, when an erase/write cycle of a memory block that is provided with the read voltage becomes high.

3. A memory comprising:
a plurality of memory blocks;
a row circuit configured to apply a read voltage to a selected page in a selected memory of the plurality of memory blocks;
a data access circuit configured to read data from the selected page;
a register configured to store an initial read voltage code;
a counter circuit configured to change a read voltage code in every read-retry operation, wherein an initial value of the read voltage code is the initial read voltage code; and a voltage generation circuit configured to generate the read voltage corresponding to the read voltage code produced by the counter circuit, wherein a counting step of the counter circuit is set to be small when the selected memory operates as an MLC, and is set to be large when the selected memory operates as an SLC.

4. A memory comprising:

a plurality of memory blocks;

a row circuit configured to apply a read voltage to a selected page in a selected memory of the plurality of memory blocks;

a data access circuit configured to read data from the selected page;

a register configured to store an initial read voltage code;

a counter circuit configured to change a read voltage code in every read-retry operation, wherein an initial value of the read voltage code is the initial read voltage code; and a voltage generation circuit configured to generate the read voltage corresponding to the read voltage code produced by the counter circuit, wherein a counting step of the counter circuit is set to be small, when an erase/write cycle of the selected memory becomes high.

5. A memory system comprising:

a memory configured to include a plurality of memory blocks and a read voltage generation circuit configured to generate a read voltage that is the reference of reading of a selected memory in the memory blocks; and a memory controller configured to give an instruction of a read-retry operation on the selected memory block to the memory, when reading on the selected memory block has failed, wherein the read voltage generation circuit includes:

a register configured to store an initial read voltage code;

a counter circuit configured to change a read voltage code in every read-retry operation, wherein an initial value of the read voltage code is the initial read voltage code; and a voltage generation circuit configured to generate a read voltage corresponding to the read voltage code produced by the counter circuit, wherein a counting step of the counter circuit is set to be small when the selected memory operates as an MLC, and is set to be large when the selected memory operates as an SLC.

6. A memory system comprising:

a memory configured to include a plurality of memory blocks and a read voltage generation circuit configured to generate a read voltage that is the reference of reading of a selected memory in the memory blocks; and a memory controller configured to give an instruction of a read-retry operation on the selected memory block to the memory, when reading on the selected memory block has failed, wherein the read voltage generation circuit includes:

a register configured to store an initial read voltage code:

a counter circuit configured to change a read voltage code in every read-retry operation, wherein an initial value of the read voltage code is the initial read voltage code; and a voltage generation circuit configured to generate a read voltage corresponding to the read voltage code produced by the counter circuit, wherein a counting step of the counter circuit is set to be small when an erase/write cycle of the selected memory is increased.

* * * * *